United States Patent [19]

Irving

[11] Patent Number: 4,579,809
[45] Date of Patent: Apr. 1, 1986

[54] POSITIVE IMAGE FORMATION

[75] Inventor: Edward Irving, Burwell, England

[73] Assignee: Ciba-Geigy Corporation, Ardsley, N.Y.

[21] Appl. No.: 541,617

[22] Filed: Oct. 13, 1983

[30] Foreign Application Priority Data

Oct. 22, 1982 [GB] United Kingdom ............... 8230302
Aug. 9, 1983 [GB] United Kingdom ............... 8321379

[51] Int. Cl.$^4$ ................. G03C 1/70; C08F 283/00; C08G 63/76; C08G 69/48
[52] U.S. Cl. .................. 430/283; 430/287; 430/288; 430/285; 430/284; 430/326; 525/418; 525/419; 525/420; 525/421; 525/455; 525/454; 525/928
[58] Field of Search .............. 430/287, 288, 285, 284, 430/283, 326; 525/418, 419, 420, 421, 455, 454, 928

[56] References Cited

U.S. PATENT DOCUMENTS

| | | | |
|---|---|---|---|
| 3,957,512 | 5/1976 | Kleeberg et al. | 96/35.1 |
| 4,040,831 | 8/1977 | Rubner et al. | 96/35.1 |
| 4,311,785 | 1/1982 | Ahne et al. | 430/283 |
| 4,321,319 | 3/1982 | Shoji et al. | 430/285 |
| 4,366,230 | 12/1982 | Ahne et al. | 430/325 |
| 4,371,685 | 2/1983 | Ahne et al. | 430/281 |
| 4,385,165 | 5/1983 | Ahne et al. | 528/53 |
| 4,414,312 | 11/1983 | Goff et al. | 430/288 |
| 4,451,551 | 5/1984 | Kataoka et al. | 430/285 |

OTHER PUBLICATIONS

Julius Grant, "peri–" in *Hackh's Chemical Dictionary*, 4th ed., McGraw-Hill Book Company, New York, 1969, p. 499.
H. Bennett, ed. "peri–" in *Concise Chemical and Technical Dictionary*, Third Edition, Chemical Publishing Co., Inc., New York, N.Y., 1974, p. 794.
R. Rubner, et al. Photographic Science and Engineering, 1979, 23, 303–309.
Derwent C.P.I. Abstract No. 15769C/09.

*Primary Examiner*—John E. Kittle
*Assistant Examiner*—Cynthia Hamilton
*Attorney, Agent, or Firm*—Harry Falber

[57] ABSTRACT

Compositions that may be irradiated to form positive images useful in the manufacture of printing plates and printed circuits comprise (i) an organic solvent-soluble, radiation sensitive prepolymer which is a polyaddition or polycondensation product of a polyfunctional carbocyclic or heterocyclic compound containing at least 2 groups R capable of undergoing an addition or condensation reaction, and at least one polyfunctional carbocyclic or heterocyclic compound having at least 2 groups capable of adding to, or condensing with the groups R, this prepolymer having at least one group —COOR$^1$ in the ortho- or peri-position to a group formed by reaction of a group R, where R$^1$ is an organic radical with one or more double or triple bonds capable of being dimerized or polymerized by radiation-induction, and (ii) 1–25% by weight of an unsaturated mono- or dicarboxylic acid of formula

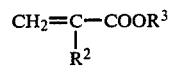

where
R$^2$ is —H or —CH$_3$ and
R$^3$ is —H or an alkylene chain linked through an ester group to a mono- or di- carboxylic acid and which may contain further groups of formula

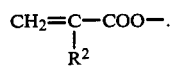

A preferred prepolymer (i) is a polyamide having repeating units of formula

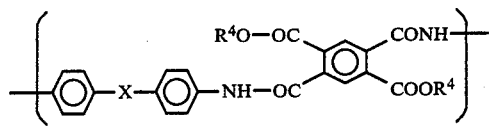

where R$^4$ is a photopolymerizable group, especially a (meth)acryloyloxyalkyl, and X is a covalent bond, —O—, —S—, —CO—, —SO$_2$—, or alkylene.

15 Claims, No Drawings

POSITIVE IMAGE FORMATION

This invention relates to a process for the formation of an image using a positive photoresist, to compositions suitable for use in this process, and to supports bearing an image produced by this process.

In the production of an image using a positive photoresist, portions of the resist that are exposed to actinic radiation are rendered more soluble in, or more easily removable by, a developer than are the unexposed portions. The exposed portions can consequently be removed with the developer, leaving the unexposed portions intact, to form a positive image. Such image-forming processes have been found to be particularly useful in the manufacture of printing plates and printed circuits.

Developers used in the production of images usually contain organic solvents. However, there has been a trend away from such solvents in favour of aqueous developers, in order to avoid the risks of toxicity, flammability, and pollution attendant upon the use of organic solvents.

In British patent specification No. 1 467 226, and its addition, No. 1 512 973, there are disclosed certain organic solvent-soluble, radiation-sensitive prepolymers that are polyaddition or polycondensation products of
 (1) at least one polyfunctional carbocyclic compound and/or heterocyclic compound containing
  (a) at least two groups R capable of undergoing an addition or condensation reaction, and
  (b) at least one radiation-reactive group $-COOR^1$, the or each group $R^1$ being an organic radical with one or more double or triple bonds capable of being dimerised or polymerised by radiation-induction and the or each group $-COOR^1$ being in the ortho- or peri-position with respect to a group R, and
 (2) at least one polyfunctional carbocyclic compound and/or heterocyclic compound containing at least two groups capable of undergoing an addition or condensation reaction with the groups R.

Suitable combinations of chemical functions which undergo the addition or condensation reactions include acid chlorides with amines or acids with isocyanates to give polyamides, amines with isocyanates to give polyureas, and phenols or polyols with isocyanates to give polyurethanes. Suitable radiation-induced dimerisable or polymerisable groups include allyl, acryloyl, and methacryloyl groups. After irradiation, these prepolymers give negative images when developed by treatment with organic solvents.

In West German Offenlegungsschrift No. 2 933 826 there are disclosed oligomeric and/or polymeric precursors for polyimides, polyisoindoloquinazolindiones, polyoxazindiones and polyquinazolindiones. These precursors are radiation-sensitive and are the adducts of an olefinically-unsaturated monoepoxide, such as glycidyl acrylate or methacrylate with a carboxyl group-containing polyaddition product of an aromatic and/or heterocyclic tetracarboxylic acid dianhydride with a diamine, which may have an amide group in the ortho-position, or a carboxyl group-containing polyaddition product of an aromatic and/or heterocyclic dihydroxy dicarboxylic acid or the corresponding diamino dicarboxylic acid, with a diisocyanate. Suitable tetracarboxylic acid dianhydrides include pyromellitic acid and benzophenone tetracarboxylic acid dianhydrides, and suitable diamines that may be reacted with these include 4,4'-diaminodiphenyl ether and 4,4'-diaminodiphenyl-3,3'-dicarboxamide. Hydroxy acids that may be used include 4,4'-dihydroxydiphenylmethane-3,3'-dicarboxylic acid, and a suitable corresponding amino acid is 4,4'-diaminodiphenyl-3,3'-dicarboxylic acid. A suitable diisocyanate that may be reacted with either of these is 4,4'-diphenylmethane diisocyanate.

Following photopolymerisation and development with a solvent, the residual polymer, forming the negative image, may be heated to eliminate the photocrosslinking groups and effect ring closure to form a 'ladder' structure. Such ladder polymers are highly resistant to further heating. Details of some of these photopolymers, their crosslinking, thermal ring closure, and use are given in an article by R. Rubner et al., Photographic Science and Engineering, 1979, 23, 303–309.

It has now been found that positive photoresists that are developable in an aqueous base are obtained when the photosensitive prepolymers described in the abovementioned Patent Specification are mixed with certain radiation-sensitive unsaturated carboxylic acids to form novel compositions, and these are then irradiated. Such behaviour is neither described nor indicated in the abovementioned publications, which mention only the preparation of negative images using organic solvents as the developing media.

Accordingly, this invention provides a composition comprising:
 (i) an organic solvent-soluble, radiation-sensitive prepolymer, being a polyaddition or polycondensation product of
  (1) at least one polyfunctional carbocyclic compound and/or heterocyclic compound containing at least two groups R capable of undergoing an addition or condensation reaction, and
  (2) at least one polyfunctional carbocyclic compound and/or heterocyclic compound containing at least two groups capable of undergoing an addition or condensation reaction with the groups R,
the prepolymer having at least one group $-COOR^1$ in the ortho- or peri-position with respect to a group formed by reaction of a group R, where $R^1$ is an organic radical with one or more double or triple bonds capable of being dimerised or polymerised by radiation-induction, and
 (ii) 1–25% by weight, and preferably 2–10% by weight, calculated on the weight of the prepolymer (i), of an unsaturated mono- or di-carboxylic acid of formula I

where
 $R^2$ represents a hydrogen atom or a methyl group and
 $R^3$ represents a hydrogen atom or an alkylene chain linked through an ester group to an aromatic or aliphatic mono- or di-carboxylic acid and which may contain one or two further groups of formula

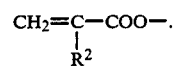

The organic solvent-soluble, radiation-sensitive prepolymer (i) may be a product formed by reacting (3) at least one polyfunctional carbocyclic and/or heterocyclic compound containing at least two groups R, as herein defined, and at least one group —COOR¹, as herein defined, in the ortho-, or peri-position with respect to a said group R, and (4) at least one polyfunctional, carbocyclic compound and/or heterocyclic compound containing at least two groups capable of undergoing an addition or condensation reaction with the groups R. Typically, a tetracarbocyclic acid dianhydride is reacted with a hydroxyalkyl acrylate or methacrylate to form the diester having two free carboxylic acid groups. This and other acids having 2 or more carboxylic acid groups and one or more groups COOR¹ may be converted into acid chlorides, which may then be reacted with compounds having 2 or more amino groups, or the acids may be reacted with compounds having 2 or more isocyanate groups. In both cases the prepolymer product is a polyamide having alkylene acrylate or methacrylate groups, or other photosensitive groups, attached to the polyamide chain through ester linkages.

The organic solvent-soluble, radiation sensitive prepolymer (i) may also be a product formed by reacting a carboxyl group-containing polyaddition or polycondensation product of (5) at least one polyfunctional carbocyclic compound and/or heterocyclic compound containing at least two groups R as herein defined, and (6) at least one polyfunctional carbocyclic compound and/or heterocyclic compound containing at least two groups capable of undergoing an addition or condensation reaction with the groups R, with (7) a compound containing at least one group —COOR¹ as herein defined and at least one group reactive with a carboxyl group, the said carboxyl group in the polyaddition or polycondensation product being in the ortho- or peri-position to the group or groups formed by reaction of the group R. Typically, a tetracarboxylic acid dianhydride is condensed with a diamine to form a polyamide having free carboxylic acid groups, which groups are reacted with a glycidyl acrylate or methacrylate to form a polyamide having pendant 3-acryloyloxy- or -methacryloyloxy-2-hydroxypropyloxycarbonyl groups.

This invention further provides a process for the formation of a positive image which comprises (A) applying to a substrate a layer of a composition according to the invention, (B) irradiating said layer with actinic radiation in a predetermined pattern, and (C) removing the irradiated part or parts of the said layer by means of an aqueous solution of a base.

Especially preferred compositions according to this invention are those in which the organic solvent-soluble, radiation sensitive prepolymer (i) is a polyamide comprising repeating units of the formula II

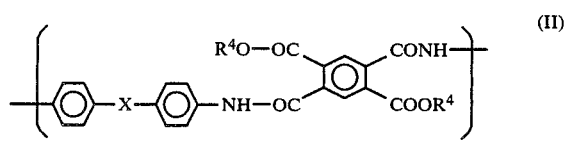

where
$R^4$ represents a group of formulae III to VIII

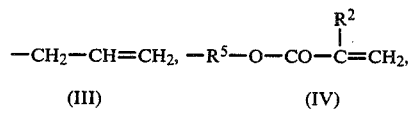

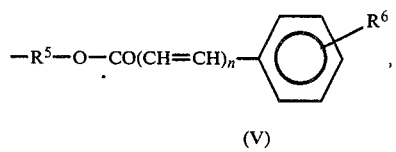

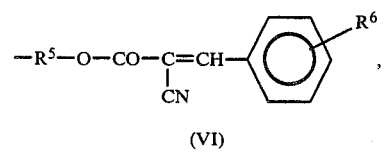

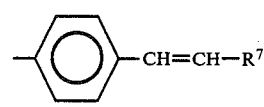

or

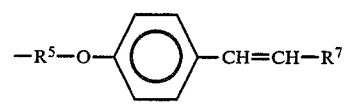

wherein
$R^2$ is as hereinbefore defined,
$R^5$ denotes an alkylene group which may be substituted on one carbon atom by a hydroxyl group,
$R^6$ denotes a hydrogen or chlorine atom or an alkyl or alkoxy group,
$R^7$ denotes a carbocyclic or heterocyclic aromatic radical attached through a ring carbon atom,
X denotes a covalent bond, an oxygen or sulphur atom, an alkylene group, a carbonyl group, or a sulphonyl group, and
n denotes 1 or 2, or it is a polyamide comprising repeating units of the formula IX

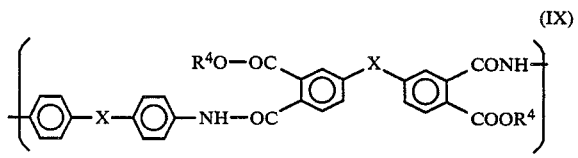

wherein $R^4$ and X are as hereinbefore defined.

Such polyamides generally have a molecular weight within the range 2000 to 10000.

As with the known process for preparing negative images from a prepolymer (i), the images formed by the new process may be heated (tempered) to form a highly heat-resistant ladder polymer with heterocyclic chain members that are formed by cyclisation. For example, when a polyamide having repeating units of formula II is used to form a positive image according to the process of the present invention, tempering the image converts it into a polyimide having repeating units of the formula X

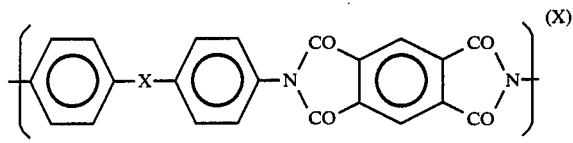

and when a polyamide having repeating units of formula IX is used, tempering the image converts it into a polyimide having repeating units of the formula XI

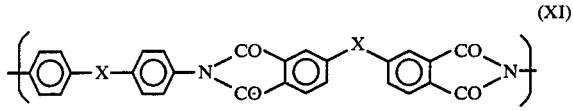

where X is as hereinbefore defined.

The process for preparing positive images may therefore contain the following additional step:

(D) heating the residual composition to effect cyclisation and formation of heterocyclic chain members.

This invention further provides positive images prepared by the above process.

It is believed, although the utility of this invention does not reside in the accuracy of this belief, that irradiation of the mixture of the prepolymer (i) and the acid of formula I causes crosslinking between these two as well as between molecules of the prepolymer alone. This results in the formation of a photocrosslinked intermediate that is insoluble in organic solvents but which carries free carboxylic acid groups derived from the acid of formula I. Treatment of such photocrosslinked products with an aqueous base effects salt formation on these free acid groups. The resulting salt is much more soluble in water than is the organic solvent-soluble (but water-insoluble) starting material. Hence a positive image is left on the surface of the substrate, the irradiated areas having been removed as salts in the aqueous base.

Preferably the alkyl, alkoxy, and alkylene groups within the definitions of the acids of formula I and the prepolymers having repeating units of formula II and IX have from 1 to 4 carbon atoms. Particularly preferred prepolymers having repeating units of formula II and IX are those in which $R^4$ represents an acryloyloxyalkyl, methacryloyloxyalkyl, acryloyloxyhydroxyalkyl or methacryloyloxyhydroxyalkyl group, especially a 2-(acryloyloxy)ethyl, 2-(methacryloyloxy)ethyl, 3-acryloyloxy-2-hydroxypropyl or 3-methacryloyloxy-2-hydroxypropyl group, and X denotes an oxygen atom or a carbonyl group.

The acid of formula I is preferably one in which $R^3$ denotes a hydrogen atom or an ethoxycarbonyl group linked directly to an aromatic ring bearing one or two carboxylic acid groups, or to an alkylene carboxylic acid group. Suitable such acids of formula I include acrylic acid, methacrylic acid, and the following acrylate group-containing acids, together with the corresponding methacrylate group-containing acids:

2-(2,4-dicarboxyphenylcarbonyloxy)ethyl acrylate, 2-(2,5-dicarboxyphenylcarbonyloxy)ethyl acrylate, 2-(2-carboxyethylcarbonyloxy)ethyl acrylate, 1,5-bis(2-(acryloyloxy)ethoxycarbonyl)benzene-2,4-dicarboxylic acid, 1,4-bis(2-(acryloyloxy)ethoxycarbonyl)benzene-2,5-dicarboxylic acid, 4,4'-bis(2-(acryloyloxy)ethoxycarbonyl)benzophenone-3,3'-dicarboxylic acid, 3,3'-bis(2-(acryloyloxy)ethoxycarbonyl)benzophenone-4,4'-dicarboxylic acid, 3,4'-bis(2-(acryloyloxy)ethoxycarbonyl)benzophenone-4,3'-dicarboxylic acid, and 2-(acryloyloxy)ethyl hydrogen phthalate.

Acids of formula I in which $R^3$ represents an alkylene chain linked through an ester group to an acid may be prepared by esterification of a di-, tri-, or tetra-carboxylic acid anhydride with a hydroxyalkyl acrylate or methacrylate, following known methods.

In photopolymerising the compositions in accordance with this invention, actinic radiation of wavelength 200–600 nm is preferably used. Suitable sources of actinic radiation include carbon arcs, mercury vapour arcs, fluorescent lamps with phosphors emitting ultraviolet light, argon and xenon glow lamps, tungsten lamps, and photographic flood lamps. Of these, mercury vapour arcs, particularly sun lamps, fluorescent sun lamps, and metal halide lamps are most suitable. The time required for the exposure of the photopolymerisable composition will depend upon a variety of factors which include, for example, the individual compounds used, the type of light source, and its distance from the irradiated composition. Suitable times may be readily determined by those familiar with photopolymerisation techniques.

The compositions preferably contain an added photoinitiator, i.e., a catalyst which, on irradiation, gives an excited state that leads to formation of free radicals which then initiate polymerisation of the composition. Examples of suitable photoinitiators are organic peroxides and hydroperoxides, α-halogen substituted acetophenones such as trichloromethyl 4'-tert. butylphenyl ketone, α-hydroxy-α-alkyl-substituted acetophenones such as 2-hydroxy-2-methyl-1-phenylpropan-1-one, benzoin and its alkyl ethers (e.g., the n-butyl ether), α-methylbenzoin, benzophenones such as benzophenone itself and 4,4'-bis(dimethylamino)benzophenone (Michler's ketone), O-alkoxycarbonyl derivatives of an oxime of benzil or of 1-phenylpropane-1,2-dione, such as benzil (O-ethoxycarbonyl)-α-monoxime and 1-phenylpropane-1,2-dione 2-(O-ethoxy)carbonyl)oxime, benzil ketals, e.g., its dimethyl ketal, substituted thioxanthones, e.g., 2-chlorothioxanthone, anthraquinones, and photoredox systems comprising a mixture of a phenothiazine dye (e.g., methylene blue) or a quinoxaline (e.g., a metal salt of 2-(m- or p-methoxyphenyl)-quinoxaline-6'- or 7'-sulphonic acid) with an electron donor such as benzenesulphinic acid or other sulphinic acid or a salt thereof such as sodium salt, or an arsine, a phosphine, or thiourea.

Suitable photoinitiators are readily found by routine experimentation. Generally, 0.05 to 10%, and preferably 0.5 to 5%, by weight of the photoinitiator is incorporated, calculated on the combined weights of the components (i) and (ii).

The compositions may also contain, if desired, an acrylate or methacrylate ester that is free from carboxylic acid groups, such as 2-hydroxyethyl acrylate and methacrylate, 2-hydroxypropyl acrylate and methacrylate, and 2-(2-hydroxyethoxy)ethyl acrylate and methacrylate.

After exposure, the exposed portions of the composition are removed by contact with an aqueous solution of a base. Solutions used for the development of the image are preferably 0.5 to 5% aqueous sodium or potassium carbonate or hydroxide.

When the developed image is heated to form a heat-resistant structure, this heating is preferably effected at 150° to 350° C. for a period of from 5 minutes to 3 hours.

The following Examples illustrate the invention, all parts and percentages being by weight, unless otherwise stated.

Prepolymer I, used in these Examples, is prepared from pyromellitic acid dianhydride, 2-hydroxyethyl methacrylate, and 4,4'-diaminodiphenyl ether, using the method given in Example 2 of British Patent Specification No. 1 512 973.

Prepolymer II is prepared as follows:

Pyromellitic acid dianhydride (20.0 g), dry N-methylpyrrolidone (21.0 ml), and dry pyridine (30.0 ml) are stirred together and dry 2-hydroxyethyl acrylate (21.4 g) is added over ½ hour, keeping the temperature of the mixture below 30° C. The mixture is stirred at room temperature for a further 3 hours, by which time its acid value is 36.6 mg KOH/g.

The mixture is then cooled to 12°–15° C. and thionyl chloride (36.0 ml) is added over 1 hour. After stirring for a further hour at 12°–15° C. there is added 4,4'-diaminodiphenyl ether (15.0 g) and N-methylpyrrolidone (45.0 ml). The mixture is stirred overnight, during which time it is allowed to rise to ambient temperature. It is treated with ethanol (50 ml) and stirred at room temperature for 2 hours. Water (407.5 ml) added and the mixture is stirred for 2 hours, and finally ethanol (62.5 ml) is added to precipitate a brown oil.

The oil is separated from the upper layer by decantation, then dissolved in N-methylpyrrolidone (50 ml). The resultant solution is added slowly to water (2 liters). A yellow solid precipitates and is filtered off and dried at 40° C. in vacuo to give Prepolymer II.

Prepolymer III is prepared as follows:

4,4'-Diaminobenzophenone (11.9 g) is dissolved in dimethyl acetamide (120 ml) and benzophenone-3,3',4,4'-tetracarboxylic acid dianhydride (21.0 g) is added over 5 minutes, keeping the temperature of the mix below 30° C. The mix is then stirred at room temperature for a further 2 hours. 2-Hydroxyethyl methacrylate (0.49 g) is then added and the mix stirred for a further 2 hours at room temperature.

Glycidyl methacrylate (50 ml), benzydimethylamine (0.4 g) and hydroquinone (0.2 g) are then added and the mix heated to 60° C. The mix is stirred at 60° C. for 19 hours and then cooled. The polymer is then precipitated by slow addition to 1:1 v/v diethyl ether:ethanol (500 ml). The yellow solid thus formed is filtered off and dried in vacuo. This produces a polymer of acid value 32.5 mg KOH/g.

The resulting polymer (10.0 g) is dissolved in dimethyl acetamide (100 ml) and glycidyl methacrylate (1.24 g), benzyldimethylamine (0.04 g) and hydroquinone (0.02 g) are added. The resulting mix is heated at 60° C. for a further 10 hours and precipitated as described above to give a yellow solid of negligible acid content. This yellow solid is Preopolymer III.

The acids that are not commercially available which are used in these Examples are prepared as follows:

2-(2-Carboxyethylcarbonyloxy)ethyl acrylate

A mixture of succinic anhydride (30.0 g), 2-hydroxyethyl acrylate (34.2 g), tetramethylammonium chloride (0.2 g), and 2,6-di-tert. butyl-4-methyl phenol (0.15 g) is heated at 90° C. for 3 hours, by which time the infra-red spectrum of the mixture shows that almost all of the anhydride has reacted. The mixture is cooled to give the desired acid.

Mixture of 2-(2,4- and 2,5-dicarboxyphenylcarbonyloxy)ethyl acrylate

A solution of trimellitic anhydride (166.4 g), 2-hydroxyethyl acrylate (106.0 g), N-methylpyrrolidone (163.6 g), tetramethylammonium chloride (1.2 g), and 2,6-di-tert.butyl-4-methylphenol (0.8 g) is stirred at 90° C. for 3 hours, by which time the infrared spectrum of the solution shows only a trace of anhydride. This solution is referred to as Acid mixture I.

Mixture of bis(2-(methacryloyloxy)ethoxycarbonyl)benzophenonedicarboxylic acids

Benzophenone-3,4,3',4'-tetracarboxylic acid dianhydride (193.2 g), 2-hydroxyethyl methacrylate (190.0 g), tetramethylammonium chloride (0.9 g), and 2,6-di-tert-.butyl-4-methylphenol (0.6 g) are mixed and heated at 80° C. for 2 hours. The mixture is cooled and a further quantity of 2-hydroxyethyl methacrylate (122.0 g) is added. The mixture is again heated at 80° C. for 2 hours, then cooled. The mixture is shown by infra-red spectroscopy to have a negligible anhydride content and is a 2:1 mixture, on a molar basis, of 2-hydroxyethyl acrylate and the three bis(2-(methacryloyloxy)ethoxycarbonyl)benzophenonedicarboxylic acids, i.e., the 4,4'-disubstituted-3,3'-dicarboxylic acid, the 3,3'-disubstituted-4,4'-dicarboxylic acid, and the 3,4'-disubstituted 4,3'-dicarboxylic acid. This product is hereinafter referred to as Acid mixture II.

EXAMPLE 1

Prepolymer I (5 parts), acrylic acid (0.1 part), benzil dimethyl ketal (0.15 part), and N-methylpyrrolidone (7 parts) are mixed and applied to a copper-clad laminate. The coating is dried at 50° C. for 1 hour to give a tack-free film 4 μm thick.

This film is irradiated for 20 minutes under a 30 w per cm medium pressure mercury lamp at a distance of 22 cm. After irradiation the image is developed by immersion in 2% aqueous sodium hydroxide solution with gentle brushing. The exposed areas are thus washed away leaving a good positive relief image on the copper.

EXAMPLE 2

Example 1 is repeated, replacing the acrylic acid by 0.1 part of 2-(2-carboxyethylcarbonyloxy)ethyl acrylate. A good positive relief image is obtained on the copper.

EXAMPLE 3

Example 1 is repeated, replacing the acrylic acid by 0.1 part of Acid mixture I. A good positive relief image is obtained on the copper. The uncoated copper areas are then etched using an aqueous solution of ferric chloride (41% FeCl₃) at 35° C. The coated areas remain unaffected.

EXAMPLE 4

Example 1 is repeated, using 0.3 part of acrylic acid. The positive image is developed in 1% aqueous sodium hydroxide with gentle brushing.

EXAMPLE 5

Example 1 is repeated, replacing the acrylic acid by a mixture of Acid mixture I (0.2 part) and Acid mixture II (0.7 part).

A good positive image is obtained after immersion in 2% aqueous sodium hydroxide solution. The laminate with the image in place is heated at 300° C. for 10 minutes in order to effect tempering of the resin. The image remains on the laminate and is unaffected by further heating at 300° C.

EXAMPLE 6

Prepolymer II (5.0 parts), N-methylpyrrolidone (5.0 parts), Acid mixture I (0.4 part), Acid mixture II (0.6 part), and Michler's ketone (0.1 part) are applied to a copper-clad laminate and dried for 1 hour at 50° C., leaving a tack-free film 10 μm thick. This is irradiated for 5 minutes under a 5000 w metal halide lamp at a distance of 750 mm. Development in 1% aqueous sodium hydroxide solution gives a good positive image.

EXAMPLE 7

Prepolymer III (5.0 parts), N-methylpyrrolidone (10.0 parts), benzildimethylketal (0.2 part) and acrylic acid (0.04 part) are applied to copper-clad laminate and dried for 1 hour at 50° C., leaving a tack-free film. This is irradiated under a 5000 w metal halide lamp at a distance of 750 mm. Development in 2% aqueous sodium hydroxide solution gives a positive image.

What is claimed is:

1. A composition comprising
   (i) an organic solvent-soluble, radiation-sensitive prepolymer, being a polyaddition or polycondensation product of
   (1) at least one polyfunctional carbocyclic compound containing at least two groups R capable of undergoing an addition or condensation reaction, and
   (2) at least one polyfunctional carbocyclic compound containing at least two groups capable of undergoing an addition or condensation reaction with the groups R,
   the prepolymer having at least one group —COOR¹ in the ortho- or peri-position with respect to a group formed by reaction of a group R,
       where R¹ is an organic radical with one or more double or triple bonds capable of being dimerised or polymerised by radiation-induction, and
   (ii) 1–25% by weight, calculated on the weight of the prepolymer (i), of an unsaturated mono- or di-carboxylic acid of formula I $$CH_2=\underset{R^2}{\overset{|}{C}}-COOR^3 \qquad (I)$$

where
R² represents a hydrogen atom or a methyl group and

R³ represents a hydrogen atom or an alkylene chain linked through an ester group to an aromatic or aliphatic mono- or di-carboxylic acid and which contain zero to two further groups of formula $$CH_2=\underset{R^2}{\overset{|}{C}}-COO-.$$

2. A composition according to claim 1, in which the prepolymer (i) is a product formed by reacting
   (3) at least one polyfunctional carbocyclic compound containing at least two groups R, as defined in claim 1, and at least one group —COOR¹, as defined in claim 1, in the ortho-, or peri-position with respect to a said group R, and
   (4) at least one polyfunctional carbocyclic compound containing at least two groups capable of undergoing an addition or condensation reaction with the groups R.

3. A composition according to claim 2, in which the prepolymer (i) is a polyamide obtained from an acid having two or more carboxylic acid groups as the groups R and having one or more groups —COOR¹
   (a) by converting the carboxylic acid groups into acid chloride groups and reacting the resulting acid chloride with a compound having two or more amino groups, or
   (b) by reaction of the acid with a compound having two or more isocyanate groups.

4. A composition according to claim 1, in which the prepolymer is a product formed by reacting a carboxyl group-containing polyaddition or polycondensation product of
   (5) at least one polyfunctional carbocyclic compound containing at least two groups R as defined in claim 1, and
   (6) at least one polyfunctional carbocyclic compound containing at least two groups capable of undergoing an addition or condensation reaction with the groups R,
with
   (7) a compound containing at least one group —COOR¹ as defined in claim 1, and at least one group reactive with a carboxyl group, the said carboxyl group in the polyaddition or polycondensation product being in the ortho- or peri-position to a group formed by reaction of a group R.

5. A composition according to claim 4, in which the prepolymer (i) is one obtained by reaction of a polyamide having free carboxylic acid groups with a glycidyl group-containing acrylate or methacrylate.

6. A composition according to claim 1, in which the prepolymer (i) is a polyamide comprising repeating units of the formula II

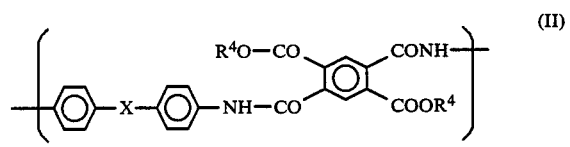

where
R⁴ represents a group of formulae III to VIII

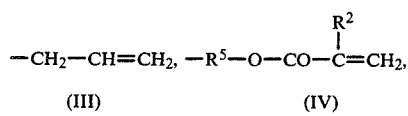

(III)    (IV)

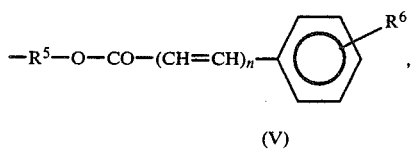

(V)

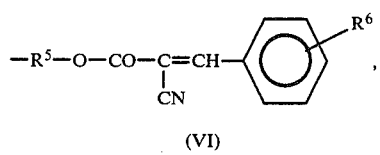

(VI)

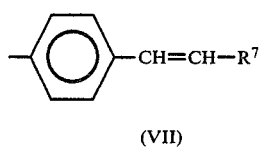

(VII)

or

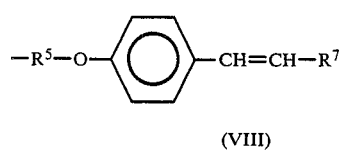

(VIII)

wherein

R² is as defined in claim 1,

R⁵ denotes an alkylene group or an alkylene group substituted on one carbon atom by a hydroxyl group, R⁶ denotes a hydrogen or chlorine atom or an alkyl or alkoxy group, R⁷ denotes a carbocyclic aromatic radical attached through a ring carbon atom, X denotes a covalent bond, an oxygen or sulphur atom, an alkylene group, a carbonyl group, or a sulphonyl group, and n denotes 1 or 2, or the prepolymer (i) is a polyamide comprising repeating units of the formula IX

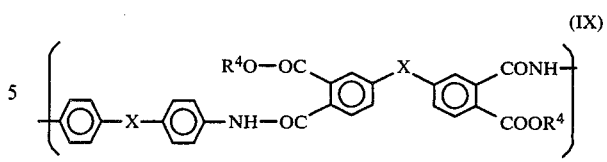

(IX)

7. A composition according to claim 6, in which alkyl, alkoxy, and alkylene within the definitions of the R⁵, R⁶ and X substituents have from 1 to 4 carbon atoms.

8. A composition according to claim 6, in which R⁴ denotes an acryloyloxyalkyl, methacryloyloxyalkyl, acryloyloxyhydroxyalkyl or methacryloyloxyhydroxyalkyl group.

9. A composition according to claim 6, in which R⁴ denotes a 2-(acryloyloxy)ethyl, 2-(methacryloyloxy)ethyl, or 3-acryloyloxy-2-hydroxypropyl or 3-methacryloyloxy-2-hydroxypropyl group.

10. A composition according to claim 6, wherein X denotes an oxygen atom or a carbonyl group.

11. A composition according to claim 1, in which R³ in the acid of formula I denotes a hydrogen atom or it denotes an ethoxycarbonyl group linked directly to an aromatic group bearing one or two carboxylic acid groups or to an alkylene carboxylic acid group.

12. A composition according to claim 11, in which the acid of formula I is acrylic acid, methacrylic acid or one of the following acrylate group-containing acids or the corresponding methacrylate group-containing acids:

2-(2,4-dicarboxyphenylcarbonyloxy)ethyl acrylate, 2-(2,5-dicarboxyphenylcarbonyloxy)ethyl acrylate, 2-(2-carboxyethylcarbonyloxy)ethyl acrylate, 1,5-bis(2-acryloyloxyethoxycarbonyl)-benzene-2,4-dicarboxylic acid, 1,4-bis(2-acryloyloxyethoxycarbonyl)-benzene-2,5-dicarboxylic acid, 4,4'-bis(2-acryloyloxyethoxycarbonyl)-benzophenone-3,3'-dicarboxylic acid, 3,3'-bis(2-acryloyloxyethoxycarbonyl)benzophenone-4,4'-dicarboxylic acid, 3,4'-bis(2-acryloyloxyethoxycarbonyl)benzophenone-4,3'-dicarboxylic acid, and 2-acryloyloxyethyl hydrogen phthalate.

13. A composition according to claim 1, which comprises 2 to 10% by weight of the acid of formula I, calculated on the weight of the prepolymer (i).

14. A composition according to claim 1, in which the said composition further contains 0.05 to 10% by weight of an added photoinitiator, calculated on the combined weights of the components (i) and (ii).

15. A composition according to claim 1, in which the said composition further contains an acrylate or methacrylate ester that is free from carboxylic acid groups.

* * * * *